United States Patent
Even et al.

(10) Patent No.: US 10,629,773 B2
(45) Date of Patent: Apr. 21, 2020

(54) LIGHT-EMITTING DIODE COMPRISING AT LEAST ONE WIDER BANDGAP INTERMEDIATE LAYER PLACED IN AT LEAST ONE BARRIER LAYER OF THE LIGHT-EMITTING ZONE

(71) Applicant: COMMISSARIAT A L'ENERGIE ATOMIQUE ET AUX ENERGIES ALTERNATIVES, Paris (FR)

(72) Inventors: Armelle Even, Regensburg (DE); Miryam Elouneg-Jamroz, Grenoble (FR); Ivan-Christophe Robin, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/096,534

(22) PCT Filed: Apr. 25, 2017

(86) PCT No.: PCT/EP2017/059711
§ 371 (c)(1),
(2) Date: Oct. 25, 2018

(87) PCT Pub. No.: WO2017/186666
PCT Pub. Date: Nov. 2, 2017

(65) Prior Publication Data
US 2019/0157505 A1 May 23, 2019

(30) Foreign Application Priority Data

Apr. 27, 2016 (FR) ...................... 16 53738

(51) Int. Cl.
*H01L 33/12* (2010.01)
*H01L 33/06* (2010.01)
(Continued)

(52) U.S. Cl.
CPC .............. *H01L 33/12* (2013.01); *H01L 33/06* (2013.01); *H01L 33/145* (2013.01); *H01L 33/32* (2013.01); *H01L 33/14* (2013.01)

(58) Field of Classification Search
CPC combination set(s) only.
See application file for complete search history.

(56) References Cited

U.S. PATENT DOCUMENTS

| 9,985,168 B1* | 5/2018 | Kuhr .................. H01L 33/0025 |
| 2006/0054926 A1* | 3/2006 | Lahreche .............. H01L 29/155 257/194 |

(Continued)

FOREIGN PATENT DOCUMENTS

| WO | WO 2005/076374 A1 | 8/2005 |
| WO | WO 2014/154690 A1 | 10/2014 |

(Continued)

OTHER PUBLICATIONS

International Search Report dated Jul. 3, 2017 in PCT/EP2017/059711 filed on Apr. 25, 2017.

(Continued)

*Primary Examiner* — Nduka E Ojeh
(74) *Attorney, Agent, or Firm* — Oblon, McClelland, Maier & Neustadt, L.L.P.

(57) ABSTRACT

Disclosed is a light-emitting diode containing: first and second semiconductor layers respectively n-doped and p-doped, forming a p-n junction; an active zone placed between the first and second layers, including an $In_xGa_{1-x}N$ emitting layer able to form a quantum well, and two $In_YGa_{1-Y}N$, where $0<Y<X$, barrier layers between which the emitting layer is placed; and an intermediate layer, which is placed either in the barrier layer located between the emitting layer and the first layer and portions of which are then on either side of the intermediate layer, or placed between the barrier layer and the emitting layer. The intermediate layer includes a III-N semiconductor of bandgap wider than that of the barrier layer. The second layer includes GaN or $In_WGa_{1-W}N$, where $0<W<Y$, and the first layer includes $In_VGa_{1-V}N$, where $V>W>0$.

12 Claims, 3 Drawing Sheets

(51) Int. Cl.
*H01L 33/32* (2010.01)
*H01L 33/14* (2010.01)

(56) References Cited

U.S. PATENT DOCUMENTS

| | | |
|---|---|---|
| 2008/0149917 A1 | 6/2008 | Park |
| 2009/0152586 A1 | 6/2009 | Lee et al. |
| 2009/0278113 A1* | 11/2009 | Chung .................. H01L 33/06 257/13 |
| 2009/0315018 A1* | 12/2009 | Hudait .................. B82Y 10/00 257/24 |
| 2011/0204394 A1 | 8/2011 | Hikosaka et al. |
| 2013/0187168 A1 | 7/2013 | Iwayama et al. |
| 2014/0008607 A1* | 1/2014 | Wang .................... H01L 33/06 257/13 |
| 2014/0264408 A1 | 9/2014 | Debray et al. |
| 2015/0270442 A1* | 9/2015 | Chae .................. H01L 25/0753 257/88 |
| 2016/0049544 A1 | 2/2016 | Robin et al. |
| 2016/0118540 A1* | 4/2016 | Dong .................... H01L 33/06 257/13 |
| 2016/0126410 A1 | 5/2016 | Debray et al. |
| 2016/0126411 A1* | 5/2016 | Saito .................... H01L 33/06 257/13 |
| 2016/0270176 A1 | 9/2016 | Robin et al. |
| 2017/0279019 A1* | 9/2017 | Ueda .................... H01L 33/62 |
| 2017/0294554 A1* | 10/2017 | Tani .................... H01L 21/205 |

FOREIGN PATENT DOCUMENTS

| | | |
|---|---|---|
| WO | WO 2015/008871 A1 | 1/2015 |
| WO | WO 2015/059296 A1 | 4/2015 |

OTHER PUBLICATIONS

Preliminary French Search Report dated Oct. 28, 2016 in FR 1653738 filed on Apr. 27, 2016.

* cited by examiner

LIGHT-EMITTING DIODE COMPRISING AT LEAST ONE WIDER BANDGAP INTERMEDIATE LAYER PLACED IN AT LEAST ONE BARRIER LAYER OF THE LIGHT-EMITTING ZONE

TECHNICAL FIELD AND PRIOR ART

The invention relates to the field of light emitting diodes (LEDs) comprising one or more quantum wells.

In the current manufacturing technique of LEDs from thin layer GaN/InGaN semiconductors, each LED includes an active zone comprising several quantum wells formed by emissive layers of InGaN each disposed between two barrier layers of GaN. This active zone is disposed in the depletion zone of a p-n junction formed by two layers of GaN, the first one being n-doped and the other one p-doped. The semiconductors of the active zone, that is those forming the emissive layers and the barrier layers, have an intrinsic doping, that is are not intentionally doped (but includes a concentration of residual donors $n_{nid}$ in the order of $10^{17}$ donors/cm$^3$). When a forward biasing voltage is applied to the terminals of the p-n junction, a current penetrates the p-n junction and the charge carriers (electrons and holes) can be radiatively recombined in the depletion zone of the p-n junction. The charge carriers are preferentially located in the emissive layers, which increases by several orders of magnitude the radiative recombination rate in the depletion zone with respect to a simple p-n junction not including a quantum well. The active zone typically includes between three and six quantum wells. The emissive layers each have a thickness which ranges for example between 1 nm and 5 nm, and InGaN of these emissive layers includes an indium concentration for example between 5% and 40%.

A LED such as described above has a current-light conversion efficiency, also called radiative efficiency or even internal quantum efficiency (or IQE), which is maximum when the LED is subjected to a low current density, in the order of 10 A/cm$^2$. At higher current densities, the radiative efficiency of the LED abruptly drops, which thus limits the efficiency of such a LED used with a strong operating power. This phenomenon is called "LED droop".

One of the factors limiting the radiative efficiency in the LEDs is the low hole current capable of passing through the p-n junction, because of the low hole mobility. Indeed, most of the holes tend to build up in the emissive layer lying on the side of the p-doped GaN layer of the p-n junction, and it is thus in this emissive layer that most of the radiative recombinations occur.

In order to increase this hole current, the barrier layers of GaN can be replaced with barrier layers of InGaN. Document WO 2014/154690 A1 also provides, to facilitate circulation of holes in the active zone of the LED, to make an asymmetric p-n junction comprising a buffer layer of InGaN interposed between the n-doped GaN layer and the active zone. These solutions make it possible to achieve circulation of a stronger hole current through the p-n junction and a better hole distribution in the different emissive layers of the active zone, while forming a higher electron barrier in order to limit the overflow thereof. In comparison with a structure comprising barrier layers of GaN, the decrease in the lattice stress between barrier layers of $In_yGa_{1-y}N$ and the emissive layers of $In_XGa_{1-X}N$, where X>Y, also reduces the electric field in the emissive layers and thereby improves the radiative efficiency by increasing the wave function overlap between electrons and holes.

Making an active zone comprising emissive layers and barrier layers of InGaN requires implementing an epitaxial growth of a layer of InGaN a few tens of nanometres thick. But, the crystal quality of such a thick layer of InGaN synthesised on a layer of GaN is limited, and especially since the indium proportion in InGaN is high. This is due to the significant different (~11%) of the lattice constant between GaN and InN. During the growth of the crystal of InGaN, the strong stress generated in the crystal causes the appearance of V-shaped hole, or "V-pit" type defects, and spatial indium inhomogeneities up to the segregation of metallic indium phases. These defects also create a growth surface roughness which can reach several nanometres, which can dramatically affect the growth of quantum wells with homogenous thicknesses and a good crystal quality. The higher the indium rate in InGaN, and the more frequent the defects due to stress. A strong defect density causes a strong density of centres of non-radiative recombinations, and thus a decrease in the optical quality of the material obtained having repercussions on the radiative efficiency of the LED. In addition, defects are also inherent to the growth of InGaN itself when the same is not stressed.

DISCLOSURE OF THE INVENTION

One purpose of the present invention is to provide a solution to increase the radiative efficiency of a light emitting diode comprising at least one quantum well formed by an emissive layer of InGaN and barrier layers of InGaN regardless of the current density with which the diode is used, while maintaining crystal quality by avoiding the appearance of defects upon making the active zone of the diode.

To that end, the invention provides a light emitting diode comprising at least:

a first layer comprising an n-doped semiconductor and a second layer comprising a p-doped semiconductor, the first and second layers forming a p-n junction;

an active zone disposed between the first and second layers, comprising at least one emissive layer including $In_XGa_{1-X}N$ and able to form a quantum well, and at least two barrier layers including $In_YGa_{1-Y}N$ and between which the emissive layer is disposed, with X and Y being real numbers such that 0<Y<X;

an intermediate layer, disposed in the barrier layer lying between the emissive layer and the first layer such that parts of said barrier layer are disposed on either side of the intermediate layer, or disposed between said barrier layer and the emissive layer, the intermediate layer including a III-N type semiconductor the band gap of which is higher than that of the semiconductor of said barrier layer.

Thus, one or more intermediate layers are disposed within one or more barrier layers, or against one or more barrier layers, of the active zone of the LED. The barrier layers and emissive layers include InGaN. This (these) intermediate layer(s) include(s) a material with a band gap higher than that of the material of the barrier layer(s). This (these) intermediate layer(s) enable(s), upon making the active zone, a crystal of InGaN with a better optical quality to be obtained and the growth surface roughness of InGaN to be reduced, especially since the indium rate, or indium concentration, in InGaN of the active zone is higher. The presence of this (these) intermediate layer(s) is thus particularly interesting for a LED for emitting light in a wavelength range corresponding to green and/or red colour because such a LED is made from InGaN having a strong indium rate, typically between about 20% and 45%.

By using this (these) intermediate layer(s) (the material of which has a higher band gap than that of the materials of the emissive layer(s) and barrier layers) in an active zone including InGaN, those skilled in the art could expect that charge circulation is blocked or reduced because of the use of a material with a higher band gap in the active zone. But, counter-intuitively, such intermediate layers positioned within the barrier layers between the emissive layers (or only between the emissive layer and the first layer when the LED includes a single emissive layer) result in modifying charge distribution in the quantum wells but promoting radiative recombinations in the emissive layers, because holes better circulate in the active zone by virtue of the barrier layers of InGaN and because the intermediate layers result in increasing the hole amount in the quantum well(s) located on the side of the second p-doped semiconductor layer. Thus, this generates a better balance of the number of electrons and holes in the quantum well(s) on the side of the second p-doped semiconductor layer, which is reflected by a greater number of radiative recombinations in this (these) quantum well(s). A relative increase in the radiative recombinations is all the more significant that the InN fraction in InGaN of the active zone is high (an increase in the InN fraction increases the number of non-radiative recombinations because of a greater crystal defect density). Thus, the increase of non-radiative losses is better counterbalanced with a better charge balance.

This (these) intermediate layer(s) thus enable(s) the radiative efficiency of the LED to be increased with respect to a LED with a similar structure but which would not include this (these) intermediate layer(s).

A III-N type semiconductor corresponds to a semiconductor including the nitrogen element with one or more elements of the group 13 from the periodic table of elements, for example InGaN, AlGaN, AlInGaN or BGaN.

The second layer may include GaN and the first layer may include $In_VGa_{1-V}N$, with V being a real number such that $0≤V$ or such that $0<V$. Alternatively, the second layer may include $In_WGa_{1-W}N$ and the first layer may include $In_VGa_{1-V}N$, with V and W being real numbers such that $0<W<Y$ and $0<W<V$.

According to the invention:
the second layer includes GaN and the first layer includes $In_VGa_{1-V}N$, with V a real number such that $0<V$; or
the second layer includes $In_WGa_{1-W}N$ and the first layer includes $In_VGa_{1-V}N$, with V and W being real numbers such that $0<W<Y$ and $0<W<V$.

When the first layer includes InGaN, the stress within the active zone which also includes InGaN is relaxed with respect to an active zone formed on a layer of GaN-n. This stress relaxation enables the layers of the active zone to be made with higher indium concentrations, for example higher than about 20% or higher than about 25%.

In addition, the crystal quality of InGaN depends on its growth temperature. Thus, by comparing a first active zone made from a layer of GaN and a second active zone made from a layer of InGaN, for a same indium concentration in the first and second active zones, the temperature for implementing growth can be higher when this growth is made from a layer of InGaN. The crystal quality achieved upon making the second active zone is higher than that achieved upon making the first active zone.

The light emitting diode may further include a growth substrate including InGaN on which the first layer is disposed, and the first layer may include $In_VGa_{1-V}N$, with $0<V$ and the second layer may include $In_WGa_{1-W}N$ with $0<W$. Such a growth substrate of InGaN enables the stress relaxation to be further improved for the layers of InGaN made on this growth substrate, and thus indium concentrations further higher, for example higher than or equal to about 30%, to be reached within the light emitting diode.

A particularly advantageous configuration corresponds to the case where the light emitting diode includes such a growth substrate comprising InGaN as well as a first doped layer, an active zone and an intermediate layer also comprising InGaN. In this case, InGaN having a very high indium concentration can be obtained. In such a structure wholly formed by InGaN, many V-pit type defects tend to appear. However, thanks to the intermediate layers used, these defects are not found in the structure obtained.

The semiconductor of the intermediate layer may include $Al_UIn_ZGa_{1-U-Z}N$, with U and Z being real numbers such that $0≤U+Z≤1$ and $0≤Z<Y$, or may include BGaN.

When the semiconductor of the intermediate layer includes $Al_UIn_ZGa_{1-U-Z}N$, the indium concentrations Z and Y in the semiconductors of the intermediate layer and of the barrier layer in which the intermediate layer is disposed may be such that $Z≤0.8*Y$.

The thickness of the intermediate layer may be between about 0.25 nm (1 monolayer) and 10 nm, and for example between about 1 nm and 5 nm.

When the semiconductor of the intermediate layer includes $Al_UIn_ZGa_{1-U-Z}N$, the indium concentration Z in the semiconductor of the intermediate layer may vary between a first minimum value $Z_1$ and a second maximum value $Z_2$ higher than $Z_1$ along a direction substantially perpendicular to faces of the intermediate layer in contact with the barrier layer in which the intermediate layer is disposed, that is along the thickness of the intermediate layer, and such that $0≤Z_1<Z_2<Y$. This variation in the indium concentration Z may be monotonic.

The indium concentration Y in the semiconductor of the barrier layer in which the intermediate layer is disposed may vary between a first minimum value $Y_1$ and a second maximum value $Y_2$ higher than $Y_1$ along a direction substantially perpendicular to the faces of the barrier layer in contact with the intermediate layer, that is along the thickness of the intermediate layer, and such that $0≤Y_1<Y_2<X$. The direction of the variation ranging from value $Y_1$ to value $Y_2$ may correspond to the direction ranging from the first layer to the second layer, or that ranging from the second layer to the first layer. This variation in the indium concentration Y may be monotonic.

The light emitting diode may be such that:
the active zone includes several emissive layers comprising InGaN and each able to form a quantum well, and several barrier layers comprising InGaN and such that each emissive layer is disposed between two barrier layers which are in contact with said emissive layer at two opposite faces of said emissive layer,
the intermediate layer is disposed in one of the barrier layers lying between one of the emissive layers and the first layer such that parts of said one of the barrier layers are disposed on either side of the intermediate layer, or disposed between said one of the barrier layers and said one of the emissive layers,
the band gap of the semiconductor of the intermediate layer is higher than that of the semiconductor of the barrier layers and the concentrations of indium in InGaN of the emissive layers are higher than those in InGaN of the barrier layers.

In the configuration set out above, the intermediate layer may be disposed within any of the barrier layers except that lying closest to the second p-doped semiconductor layer.

The light emitting diode may also include several intermediate layers such that one or more of said intermediate layers are disposed in one or more of the barrier layers lying between one of the emissive layers and the first layer, parts of said one or more of the barrier layers being disposed on either side of each of the intermediate layers. Once again, the intermediate layers may be disposed within any of the barrier layers except that lying closest to the second p-doped semiconductor layer.

The indium concentrations in InGaN of the emissive layers may be substantially equal to each other. This configuration corresponds to a monochromatic LED with several quantum wells, for which the improvement in the radiative efficiency provided by the intermediate layers is particularly significant.

The light emitting diode may further include a buffer layer of n-doped semiconductor, which buffer layer is disposed between the first layer and the active zone, wherein said n-doped semiconductor of the buffer layer may include a band gap energy lower than or equal to about 97% of the band gap energy of the p-doped semiconductor of the second layer.

The light emitting diode may further include an electron blocking layer comprising at least one III-N type p-doped semiconductor the band gap of which is higher than that of the semiconductor of the second layer and disposed between the second layer and the active zone.

BRIEF DESCRIPTION OF THE DRAWINGS

The present invention will be better understood upon reading the description of exemplary embodiments given by way of purely indicating and in no way limiting purposes making reference to the appended drawings in which.

Identical, similar or equivalent parts of the different figures described hereinafter bear the same reference numerals so as to facilitate switching from one Fig. to the other.

The different parts shown in the figures are not necessarily drawn to a uniform scale, to make the figures more readable.

The different possibilities (alternatives and embodiments) should be understood as being non-exclusive to each other and can be combined to each other.

DETAILED DISCLOSURE OF PARTICULAR EMBODIMENTS

Figure 1:
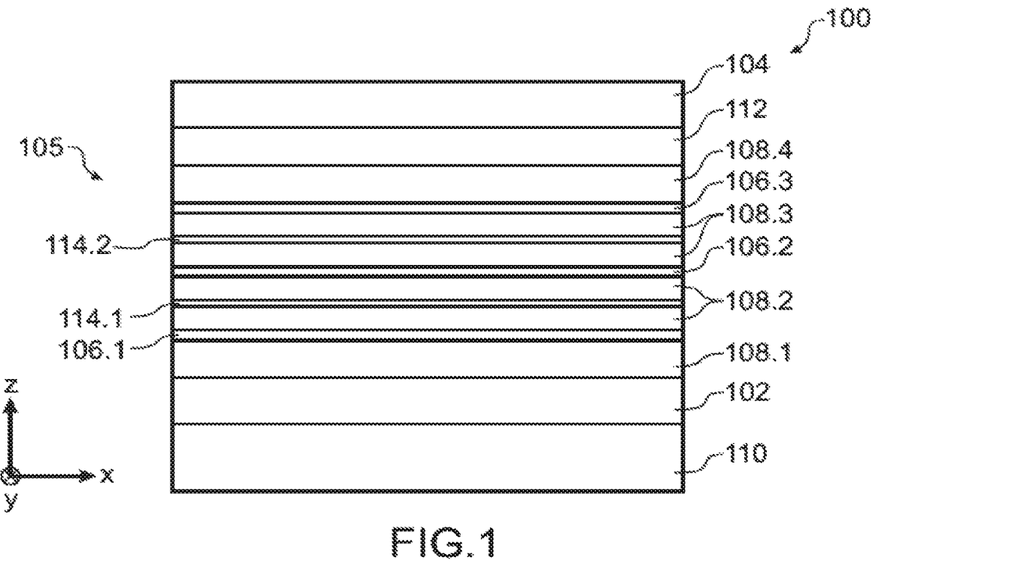
FIG. 1 schematically shows a light emitting diode, subject matter of the present invention, according to a particular embodiment.

FIG. 1 is first referred to, which shows a light emitting diode, or LED, 100 according to a particular embodiment.

In the notation $In_XGa_{1-X}N$ used, X represents the indium composition, or indium concentration, of the material, that is the indium proportion with respect to the total amount of indium and gallium in $In_XGa_{1-X}N$. An analogous notation is used for the aluminium and indium compositions in $Al_UIn_ZGa_{1-U-Z}N$.

In the particular embodiment described here, the LED 100 includes a p-n junction formed by a first layer 102 comprising n-doped InGaN (InGaN-n) with a donor concentration for example equal to about $10^{19}$ donors/cm$^3$ and a second layer 104 comprising p-doped GaN (GaN-p) with an acceptor concentration for example equal to about $10^{19}$ acceptors/cm$^3$. Both layers 102 and 104 each have for example a thickness (dimension along the axis Z shown in FIG. 1) between about 20 nm and 10 μm. Generally, the first layer 102 may have a donor concentration between about $10^{17}$ and $10^{20}$ donors/cm$^3$, and the second layer 104 may have an acceptor concentration between about $10^{15}$ and $10^{20}$ acceptors/cm$^3$.

Alternatively, it is possible that the first layer 102 includes n-doped GaN (GaN-n), although this configuration is less advantageous than a first layer 102 including InGaN-n. When the first layer 102 includes GaN, then the second layer 104 also includes GaN.

Thus, the indium concentration V in $In_VGa_{1-V}N$ of the first layer 102 is for example between about 0% (case of a first layer 102 comprising GaN) and about 20%.

Further, when the indium concentration V in $In_VGa_{1-V}N$ of the first layer 102 is non-zero, the second layer 104 may include $In_WGa_{1-W}N$ with W>0. In this case, the indium concentration W in $In_WGa_{1-W}N$ of the second layer 104 is lower than the indium concentration V in $In_VGa_{1-V}N$ of the first layer 102, and for example between about 0% and 15%.

The LED 100 includes, between the layers 102 and 104, an active zone 105 formed by an intrinsic semiconductor comprising several emissive layers 106. The LED 100 herein described includes three emissive layers 106, referenced 106.1, 106.2 and 106.3. Generally, the LED 100 may include n emissive layers 106, with n being an integer such that $n \geq 1$, and advantageously such that $3 \leq n \leq 6$. The emissive layers 106 include for example $In_{0.3}Ga_{0.7}N$ (that is comprising a proportion of 30% indium and 70% gallium) not intentionally doped (with a concentration of residual donors for example such that $n_{nid}=10^{17}$ donors/cm$^3$), with a thickness for example equal to about 3 nm.

The indium rate of InGaN of the emissive layers 106 may be different from one layer to the other, the LED 100 being in this case able to emit at different wavelengths from one emissive layer 106 to the other. But advantageously, the indium concentrations in InGaN of the emissive layers 106 are similar from one emissive layer to the other, the LED 100 corresponding in this case to a monochromatic LED. In any case, the indium concentration value within the emissive layer(s) 106 is chosen as a function of the wavelength(s) to be emitted, and for example between about 5% and 40%.

The active zone 105 of the LED 100 also includes barrier layers 108 (in the number of four in the LED 100 shown in FIG. 1, and referenced 108.1, 108.2, 108.3 and 108.4)

comprising for example $In_{0.12}Ga_{0.88}N$ (comprising a proportion of 12% indium and 88% gallium) not intentionally doped (with a concentration of residual donors for example such that $n_{nid}=10^{17}$ donors/cm³), with a thickness for example equal to about 8 nm. Two of the four barrier layers 108 are each interposed between two consecutive emissive layers 106, and the other two barrier layers 108 are each interposed between one of the emissive layers 106 and one of the layers 102 and 104. Thus, the first barrier layer 108.1 is disposed between the first layer 102 and the first emissive layer 106.1. The second barrier layer 108.2 is disposed between the first emissive layer 106.1 and the second emissive layer 106.2. The third barrier layer 108.3 is disposed between the second emissive layer 106.2 and the third emissive layer 106.3. The fourth barrier layer 108.4 is disposed between the third emissive layer 106.3 and the second layer 104. Each emissive layer 106 and both barrier layers 108 between which this emissive layer 106 lies form a quantum well.

The indium concentration values of the semiconductor of the barrier layers 108 are lower than those of the semiconductor of the emissive layers 106 and thus for example between about 1% and 20%.

Generally, the LED 100 which includes n emissive layers 106, with n being an integer higher than or equal to 1, thus includes n+1 barrier layers 108. The active zone 105 is formed by the alternate stack of the n emissive layers 106 and the n+1 barrier layers 108. The layers 106 and 108 may have residual donor concentrations between about $10^{16}$ and $10^{20}$ donors/cm³.

The layers of the active zone 105 are made by epitaxy, for example MOCVD, on a thick layer 110 of GaN forming the growth substrate. The structure thus formed by these layers is thus fully stressed on the layer 110 of GaN.

Alternatively, the layer 110, or growth substrate 110, may include InGaN. In this case, the LED 100 may advantageously correspond to a structure entirely formed by InGaN, that is the layers 110, 102, 108, 106, 104 and 114 of which include InGaN. It is also very advantageous to have a LED 100 comprising a growth substrate 110 comprising InGaN, and the layers 102, 108, 106 and 114 comprising InGaN.

In the particular embodiment described herein in connection with FIG. 1, the LED 100 also includes an electron blocking layer 112, including for example AlGaN and disposed between the last barrier layer (corresponding to the barrier layer 108 closest to the second p-doped layer 104, that is the layer 108.4 in the example shown in FIG. 1) and the second layer 104. Such an electron blocking layer 112 enables electrons transit to the second p-doped layer 104 to be prevented. Such an electron blocking layer 112 also enables the "LED droop" phenomenon, i.e. the drop of the internal quantum efficiency of the LED 100 when the current density in the LED 100 increases, to be decreased, this drop being partially due to the electron exhaust from the active zone 105 when the current increases.

When the second layer 104 includes InGaN with a non-zero concentration of indium, the electron blocking layer 112 may include GaN.

Generally, the electron blocking layer 112 comprises at least one III-N type p-doped semiconductor the band gap of which is higher than that of the semiconductor of the second layer 104.

Alternatively, the LED 100 may not include the electron blocking layer 112, the last barrier layer 108.4 being therefore disposed against the second p-doped layer 104.

The LED 100 also includes intermediate layers 114 disposed within some of the barrier layers 108. In the exemplary embodiment of the LED 100 shown in FIG. 1, a first intermediate layer 114.1 is disposed within the second barrier layer 108.2 and a second intermediate layer 114.2 is disposed within the third barrier layer 108.3. In the exemplary embodiment described here, no intermediate layer 114 is disposed within the first barrier layer 108.1 and within the last barrier layer 108.4.

These intermediate layers 114 are fine and for example, they each have a thickness between about 0.25 nm (a single layer) and 10 nm, or between about 1 nm and 5 nm. In the example of FIG. 1, each of the intermediate layers 114.1 and 114.2 has a thickness equal to about 2 nm, that is a thickness corresponding to about 8 single layers of the material of these intermediate layers 114.

Each of the intermediate layers 114 includes a III-N type semiconductor the band gap of which is higher than that of the semiconductor of the barrier layer 108 in which the intermediate layer 114 is disposed. The semiconductor of the intermediate layers 114 may be GaN, or InGaN with an indium to gallium proportion which is lower than that of InGaN of the barrier layer 108 in which the intermediate layer 114 is disposed. In other words, by considering a barrier layer 108 including $In_YGa_{1-Y}N$ and an intermediate layer 114 disposed within this barrier layer 108 and which includes $In_ZGa_{1-Z}N$, the indium proportions Y and Z are therefore such that Z<Y.

Advantageously, the indium concentrations Z and Y are such that Z≤0.8*Y, and that in order to have one or more intermediate layer(s) 114 sharply distinguished from the barrier layers 108.

In any case, the band gap of the material of the intermediate layer(s) 114 is higher than that of the material of the barrier layer(s) 108 of the LED 100.

The intermediate layers 114 are preferably made such that the indium percentage in the material of the intermediate layers 114 is as low as possible. Thus, the intermediate layers 114 preferably include GaN.

Generally, the intermediate layers 114 may include $Al_UIn_ZGa_{1-U-Z}N$, with U and Z being real numbers such that 0≤U+Z≤1 and 0≤Z<Y. Thus, the semiconductor of the intermediate layers 114 can correspond to AlGaN, AlInGaN, InGaN or even GaN. It is also possible that the intermediate layers 114 include BGaN.

The intermediate layers 114 include, as in the entire active zone 105, an intrinsic, that is not intentionally doped, semiconductor, and may have residual donor concentrations between about $10^{15}$ and $10^{20}$ donors/cm³.

The presence of intermediate layers 114 within some of the barrier layers 108 of the LED 100 enables the radiative efficiency, or internal quantum efficiency, of the LED 100 to be increased. Indeed, by integrating these intermediate layers 114 in part of the barrier layers 108 during the epitaxy implemented to form the active zone 105, the InGaN crystal obtained by forming this active zone 105 has a better optical quality than that obtained in the absence of these intermediate layers 114. Indeed, the insertion of these intermediate layers 114 enables the growth surface roughness to be reduced during the epitaxy of the active zone 105, which enables the crystal quality and thickness homogeneity of the quantum wells made to be improved. The insertion of the intermediate layers 114 within some of the barrier layers 108 also results in modifying charge distribution in the quantum wells by promoting radiative recombinations.

The different simulations described below to illustrate the effects achieved by inserting intermediate layers 114 are made with a TCAD type software, for example the SILVACO® ATLAS® simulation software.

Figure 2:
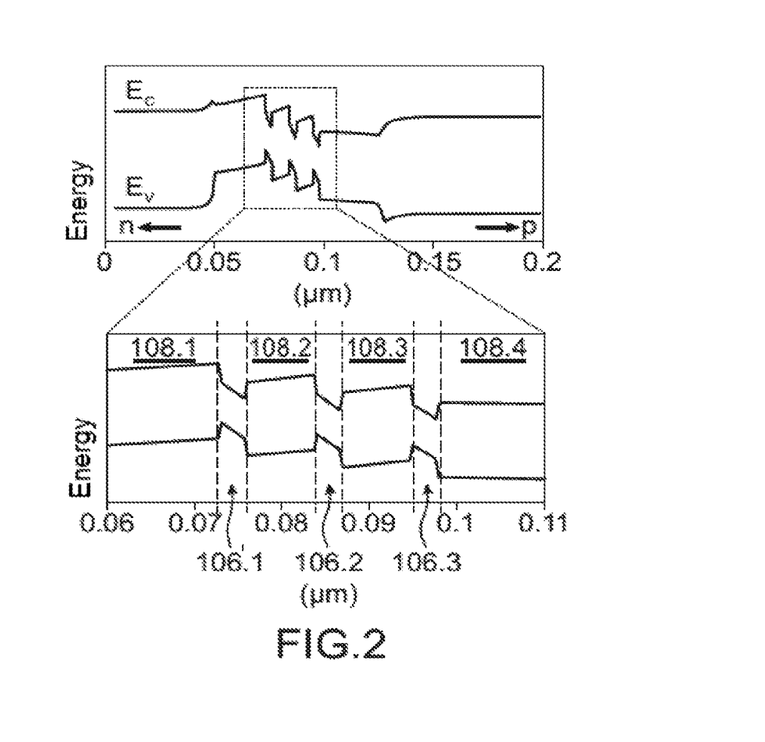
FIG. 2 shows the energy band diagram within a light emitting diode with multiple quantum wells of prior art.

FIG. 2 shows the energy band diagram (conduction band and valence band), for a current density equal to 100 A/cm², of a LED, called test LED, having a similar structure to that of the previously described LED 100 but not including the intermediate layers 114. The test LED therefore includes a stack of layers which is formed, in this order, by the layers 102, 108.1, 106.1, 108.2, 106.2, 108.3, 106.3, 108.4, 112 and 104. To simplify the read out of this diagram, references similar to those previously used for the layers of the LED 100 are written in FIG. 2 to indicate the energy levels within the different layers of the test LED.

Figure 3:
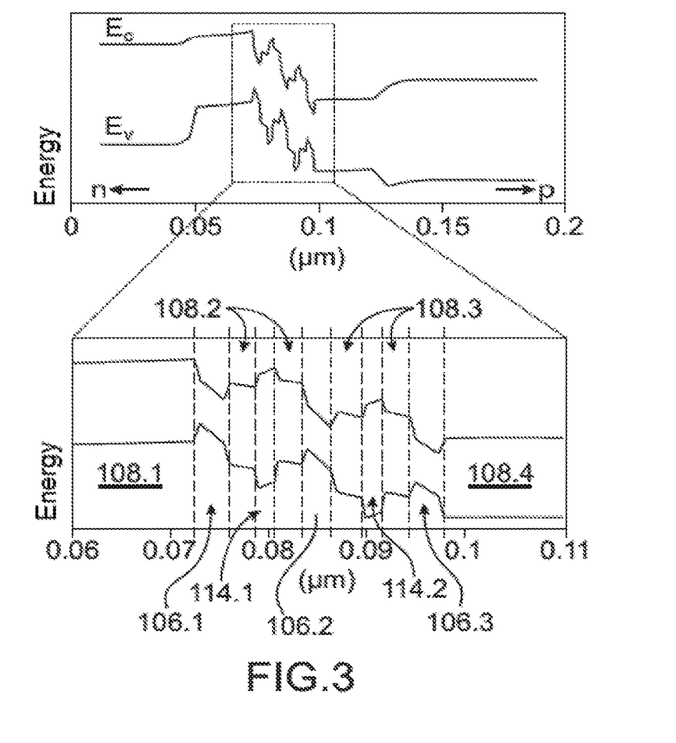
FIG. 3 shows the energy band diagram within the light emitting diode, subject matter of the present invention, according to the particular embodiment of FIG. 1.

FIG. 3 shows the energy band diagram of the LED 100 which thus includes the intermediate layers 114.1 and 114.2 as previously described in connection with FIG. 1, for a current density equal to 100 A/cm².

Figure 4:
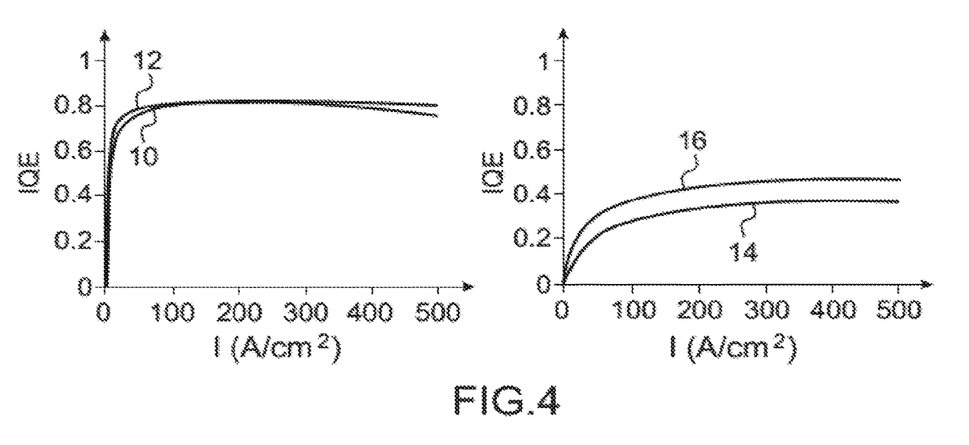
FIG. 4 shows the internal quantum efficiency value obtained in a LED, subject matter of the present invention, according to the particular embodiment of FIG. 1 as well as in a LED with multiple quantum wells of prior art, as a function of the current density, and for two values of the Shockley-Read-Hall lifetime of the minority carriers.

In FIG. 4, the curve 10 represents the radiative efficiency (IQE) value for the test LED neither including the intermediate layers 114 nor the electron blocking layer 112, and for a Shockley-Read-Hall lifetime of the minority carriers $\tau_{SRH}$=3 ns, this lifetime being representative of the non-radiative recombination efficiency within the LED (the lower the $\tau_{SRH}$ value, the more efficient the non-radiative recombinations). The curve 12 represents the radiative efficiency value for the previously described LED 100 but not including the electron blocking layer 112, and for $\tau_{SRH}$=3 ns. The curve 14 represents the radiative efficiency value for the test LED without the intermediate layers 114 nor the electron blocking layer 112, and for $\tau_{SRH}$=0.3 ns. The curve 16 represents the radiative efficiency value for the previously described LED 100 but not including the electron blocking layer 112, and for $\tau_{SRH}$=0.3 ns.

In the LED 100 and the test LED used to obtain the curves of FIG. 4, the barrier layers include $In_{0.12}Ga_{0.88}N$ and the emissive layers include $In_{0.3}Ga_{0.7}N$.

The curves 10 and 12 show that, in the case of a low non-radiative recombination efficiency, adding the intermediate layers 114 within some of the barrier layers 108 of the active zone 105 of the LED 100 does not affect the radiative efficiency of the LED 100. The curves 14 and 16 show that, in the case of a strong non-radiative recombination efficiency, adding the intermediate layers 114 within some of the barrier layers 108 of the active zone 105 of the LED 100 improves the radiative efficiency of the LED 100. Thus, for a current density equal to about 100 A/cm², adding the intermediate layers 114 switches the IQE from a value equal to about 28% (curve 14) to a value equal to about 37% (curve 16).

The IQE improvement effect is amplified when the lifetime $\tau_{SRH}$ of the quantum wells, associated with the non-radiative recombinations, decreases. On the other hand, the worse the crystal quality, the more numerous the non-radiative recombinations and the more this lifetime $\tau_{SRH}$ decreases. Adding the intermediate layers 114 is thus particularly interesting in the case where the crystal forming the layers of the active zone 105 is of poor quality, which is the case when the indium proportion in the active layers 106 is significant, as for example in the case of a LED for performing light emissions with large wavelengths. Thus, by considering the case described above with $\tau_{SRH}$=0.3 ns for the test LED, it is possible to compare the IQE obtained with that of the LED 100 at $\tau_{SRH}$=3 ns because adding the intermediate layers 114 improves the quality of the crystal obtained, and consequently increases the $\tau_{SRH}$ value. The improvement in the radiative efficiency of the LED generated by adding the intermediate layers 114 is thus much higher than the previously mentioned 9% gain (IQE switching from about 28% to about 37% between curves 14 and 16). Thus, for a current density equal to about 100 A/cm², the IQE value switches from about 28% to close to 80% thanks in particular to the addition of the intermediate layers 114.

The IQE improvement generated by adding the intermediate layers 114 is explained by a modification in the charge carrier distribution in the active zone 105. Indeed, the use of InGaN in place of GaN to make the barrier layers 108 result in decreasing the potential barriers formed by the barrier layers 108, allowing the holes whose mobility is lower to more readily reach quantum wells on the n side of the LED 100, that is on the side of the first layer 102 in the example previously described in connection with FIG. 1. This more homogeneous hole distribution between the different quantum wells of the active zone however tends to reduce the hole number in the quantum well closest to the p side of the LED, that is on the side of the second layer 104 in the previous example and which corresponds to the quantum well formed by the third emissive layer 106.3 and which is the most populated by electrons and holes and that in which the radiative recombinations are higher in number. Adding the intermediate layers 114 downstream of the hole current, that is in the barrier layers 108.2 and 108.3 in the previously described example, enables a potential barrier to be created to keep the holes which lie in the quantum well disposed closest to the second p-doped layer 104 and thus the total hole number to be increase therein. The IQE of the LED 100 is thus improved with respect to that of the test LED thanks to the presence of the intermediate layers 114 because the probability of radiative recombinations that can occur increases for a total number of carriers injected which remains the same.

Figure 5:
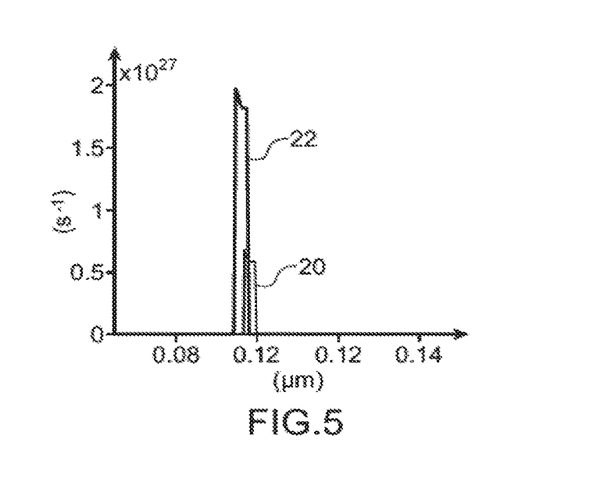
FIG. 5 shows the radiative recombination rate achieved in the third emissive layer of a LED, subject matter of the present invention, according to the particular embodiment of FIG. 1, and of a LED with multiple quantum wells of prior art.

The curve 20 of FIG. 5 represents the radiative recombination rate obtained for the test LED, and the curve 22 represents the radiative recombination rate obtained for the LED 100. These curves 20 and 22 are obtained for a current density equal to about 100 A/cm², a lifetime $\tau_{SRH}$=0.3 ns, and in the absence of an electron blocking layer in the test LED and in the LED 100. These two curves 20 and 22 actually show the strong increase in the radiative recombinations occurring in the emissive layer 106.3 closest to the second p-doped layer 104 (the radiative recombinations in the other two wells are less in number and are not visible in FIG. 5).

Figure 6:
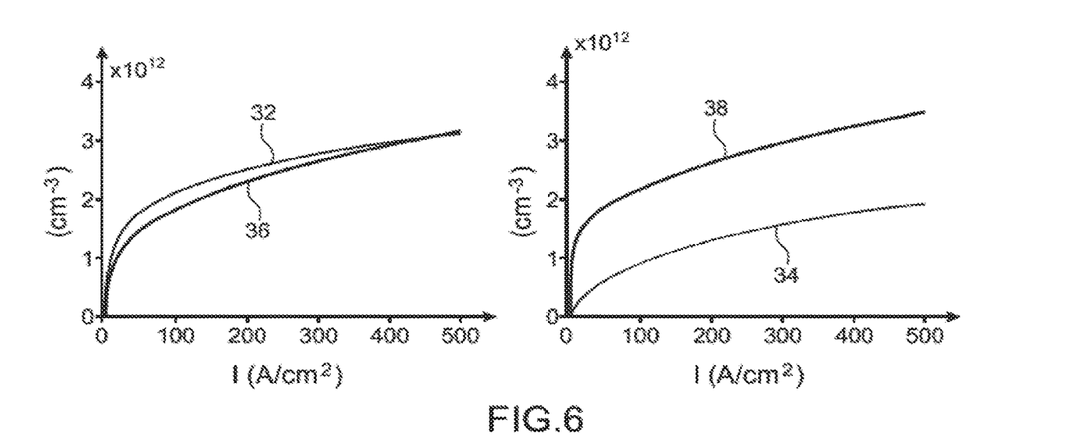
FIG. 6 shows the electron and hole concentrations obtained in the third emissive layer of a LED, subject matter of the present invention, according to the particular embodiment of FIG. 1, and of a LED with multiple quantum wells of prior art, as a function of the current density.

The curves 32 and 34 of FIG. 6 respectively represent the electron and hole concentrations in the third emissive layer 106.3 of the test LED. The curves 36 and 38 of FIG. 6 respectively represent the electron and hole concentrations obtained in the third emissive layer 106.3 of the LED 100. These values are obtained in the absence of an electron blocking layer in the test LED and in the LED 100, and for a lifetime $\tau_{SRH}$=0.3 ns. By considering a current density equal to about 100 A/cm², the curves 32 to 38 of FIG. 6 show that adding the intermediate layers 114 generates, in the third quantum well including the third emissive layer 106.3, a loss of about 13% of electrons and a gain of about 58% of holes. Adding the intermediate layers 114 thus enables a more favourable configuration to be achieved to obtain more radiative recombinations (increase in the product of the carriers) in this last quantum well present on the side of the p-doped layer, and thus the IQE of the LED to be improved.

In a particular embodiment of the LED 100 previously described in connection with FIG. 1, each of the intermediate layers 114 is disposed within a barrier layer 108 separating two neighbouring emissive layers 106.

According to a first alternative, it is possible that a single intermediate layer 114 is present in the active zone 105. In this case, this single intermediate layer 114 is disposed in the barrier layer separating the last emissive layer, that is that closest to the second p-doped layer 104, and the emissive layer neighbouring this last emissive layer. According to this first alternative, the single intermediate layer 114 present in the active zone 105 corresponds to the intermediate layer 114.2 present in the barrier layer 108.3.

According to a second alternative, it is possible that an intermediate layer 114 is disposed within each of the barrier layers 108 except that which is closest to the second p-doped layer 104 (which corresponds to the barrier layer 108.4 in the example of FIG. 1). According to this second alternative, the LED 100 would include therefore, in addition to the intermediate layers 114.1 and 114.2, a third intermediate layer 114 which would be disposed within the first barrier layer 108.1.

Further, in all the embodiments and alternatives described previously, it is also possible to include one or more intermediate layers 114 within the first layer 102. As previously, the semiconductor of this (these) intermediate layer(s) 114 has a band gap higher than that of the semiconductor of the first layer 102.

Whatever the number of intermediate layers 114 disposed within the active zone 105, no intermediate layer 114 is present in the last barrier layer which corresponds to that which is closest to the second p-doped layer 104, and that in order not to prevent the holes from reaching the emissive layer disposed against this last barrier layer.

In the particular embodiment and the previously described alternatives, a single intermediate layer 114 is disposed in a barrier layer 108. Alternatively, it is possible that several intermediate layers 114 are disposed within a same barrier layer 108.

According to another alternative, it is possible that the LED 100 includes a single quantum well formed by a single emissive layer 106 disposed between two barrier layers 108. In this case, at least one intermediate layer 114 is disposed in the barrier layer lying between the emissive layer 106 and the first layer 102. In such a configuration, this (these) intermediate layer(s) also enable(s) the LED radiative efficiency to be improved via the improvement of the crystal quality of the active zone generated by the presence of this (these) intermediate layer(s) 114, and also via a better hole blocking in the quantum well, thereby increasing the product of the carriers, and thus the number of radiative recombinations, in this well.

In the exemplary embodiments and alternatives described above, when the intermediate layer(s) 114 include(s) AlInGaN, the indium composition in the material of the intermediate layer(s) is substantially constant within this or each of these layers. Alternatively, it is possible that the indium composition, called for example Z for $Al_U In_Z Ga_{1-U-Z}N$, of the intermediate layer 114 or, when the LED 100 includes several intermediate layers 114, of one or several of the intermediate layers 114, varies between a first minimum value $Z_1$, zero or positive, and a second maximum value $Z_2$ higher than $Z_1$, along a direction substantially perpendicular to faces of the intermediate layer 114 in contact with the barrier layer 108 in which the intermediate layer 114 is disposed (that is in parallel to the axis Z). This direction may in particular be oriented in the direction from the first layer 102 to the second layer 104, that is such that the part of the intermediate layer 114 which is of a lower indium concentration ($Z_1$) lies on the side of the first layer 102, or in the direction from the second layer 104 to the first layer 102. The maximum indium concentration $Z_2$ is lower than that of the barrier layer 108 in which the intermediate layer 114 is disposed. By considering that the barrier layer 108 in which such an intermediate layer 114 is disposed includes $In_Y Ga_{1-Y}N$, the value $Z_2$ is advantageously such that $Z_2 \leq 0.8*Y$. When the LED 100 includes several intermediate layers 114, this variable indium concentration of InGaN of the intermediate layers 114 may be the same from one intermediate layer 114 to the other, or be different from one intermediate layer 114 to the other (values $Z_1$ and $Z_2$ being in this case different from one intermediate layer 114 to the other).

In the exemplary embodiments and alternatives described above, the indium composition in the material of the barrier layer(s) is substantially constant within this or each of the layers. Alternatively, it is possible that the indium composition, called for example Y for $In_Y Ga_{1-Y}N$, of one or more of the barrier layers 108 varies from a first minimum value $Y_1$ to a second maximum value $Y_2$ higher than $Y_1$, along the direction in which the different layers of the LED 100 are stacked (that is in parallel to the axis Z). The part of the barrier layer 108 with a lower indium concentration ($Y_1$) may lie preferably on the side of the first layer 102, or on the side of the second layer 104. In the case of a barrier layer 108 having such a variable indium concentration and in which one or more intermediate layers 114 are disposed, the minimum indium concentration $Y_1$ is higher than that (those) of this (these) intermediate layer(s) 114, that is such that $0 \leq Z < Y_1$.

Both alternatives set forth below can be combined, that is one or more of the intermediate layers 114 may have an indium concentration varying along their thickness and be disposed within one or more barrier layers 108 having an indium concentration varying along the thickness thereof. In this case, these variable concentrations are such that $Z_2 < Y_1$.

According to another alternative, the LED 100 may include a buffer layer of n-doped InGaN, disposed between the first layer 102 and the active zone 105. Such a buffer layer may correspond to that described in document WO 2014/154690 A1.

From the structure of the LED 100 as represented in FIG. 1, electrodes are then made such that they are electrically connected to the first and second layers 102, 104. Thus, a first electrode may be made by etching part of the layers 104, 112, 105 and 102 such that the first electrode can be electrically in contact with the first layer 102 at a side face of this first layer 102. Alternatively, the first electrode may be made by removing the layer 110 and forming the first electrode against the lower face of the first layer 102. In any case, the second electrode may be made against the upper face of the second layer 104.

The previously described LED 100, including an active zone formed by alternating quantum wells and barrier layers, and one or more intermediate layers, may be made as a planar diode, that is in the form of a stack of layers formed on a substrate, as shown in FIG. 1, the main faces of the different layers being disposed in parallel to the plane of the substrate (parallel to the plane (X,Y)). Alternatively, the LED 100 may also be made as an axial or radial nanowire, as described for example in document WO 2014/154690 A1.

The invention claimed is:
1. A light emitting diode, comprising:
a first layer comprising an n-doped semiconductor and a second layer comprising a p-doped semiconductor, the first and second layers forming a p-n junction;
an active zone disposed between the first and second layers, comprising at least one emissive layer including $In_X Ga_{1-X}N$ and configured to form a quantum well, and at least two barrier layers including $In_Y Ga_{1-Y}N$ and between which the emissive layer is disposed, with X and Y being real numbers such that $0<Y<X$; and an intermediate layer, disposed in the barrier layer lying between the emissive layer and the first layer such that parts of said barrier layer are disposed on either side of the intermediate layer, or disposed between said barrier layer and the emissive layer, the intermediate layer including a III-N type semiconductor the band gap of which is higher than that of the semiconductor of said barrier layer;

wherein:

the second layer includes $In_WGa_{1-W}N$ and the first layer includes $In_VGa_{1-V}N$, with V and W being real numbers such that $0<W<Y$ and $0<W<V$.

2. The light emitting diode according to claim 1, further comprising a growth substrate including InGaN on which the first layer is disposed.

3. The light emitting diode according to claim 1, wherein a thickness of the intermediate layer is between about 0.25 nm and 10 nm.

4. The light emitting diode according to claim 1, wherein the semiconductor of the intermediate layer includes $Al_U In_Z Ga_{1-U-Z}N$, with U and Z being real numbers such that $0 \leq U+Z \leq 1$ and $0 \leq Z<Y$, or includes BGaN.

5. The light emitting diode according to claim 4, wherein, the semiconductor of the intermediate layer includes $Al_U In_Z Ga_{1-U-Z}N$, the concentrations of indium Z and Y in the semiconductors of the intermediate layer and of the barrier layer in which the intermediate layer is disposed satisfy $Z \leq 0.8*Y$.

6. The light emitting diode according to claim 4, wherein, the semiconductor of the intermediate layer includes $Al_U In_Z Ga_{1-U-Z}N$, the concentration of indium Z in the semiconductor of the intermediate layer varies between a first minimum value $Z_1$ and a second maximum value $Z_2$ higher than $Z_1$ along a direction substantially perpendicular to faces of the intermediate layer in contact with the barrier layer in which the intermediate layer is disposed, and wherein $0 \leq Z_1 < Z_2 < Y$.

7. The light emitting diode according to claim 1, wherein the concentration of indium Y in the semiconductor of at least the barrier layer in which the intermediate layer is disposed varies between a first minimum value $Y_1$ and a second maximum value $Y_2$ higher than $Y_1$ along a direction substantially perpendicular to the faces of the barrier layer in contact with the intermediate layer, and wherein $0 \leq Y_1 < Y_2 < X$.

8. The light emitting diode according to claim 1, wherein:

the active zone includes several emissive layers comprising InGaN and each able to form a quantum well and several barrier layers comprising InGaN such that each emissive layer is disposed between two barrier layers which are in contact with said emissive layer at two opposite faces of said emissive layer, the intermediate layer is disposed in one of the barrier layers lying between one of the emissive layers and the first layer such that parts of said one of the barrier layers are disposed on either side of the intermediate layer, or disposed between said one of the barrier layers and said one of the emissive layers, and the band gap of the semiconductor of the intermediate layer is higher than that of the semiconductor of the barrier layers and the concentrations of indium in InGaN of the emissive layers are higher than those in InGaN of the barrier layers.

9. The light emitting diode according to claim 8, comprising several intermediate layers such that one or more of said intermediate layers are disposed in one or more of the barrier layers lying between one of the emissive layers and the first layer, parts of said one or more of the barrier layers being disposed on either side of each of the intermediate layers.

10. The light emitting diode according to claim 8, wherein the concentrations of indium in InGaN of the emissive layers are substantially equal to each other.

11. The light emitting diode according to claim 1, further comprising a buffer layer of n-doped semiconductor, which is disposed between the first layer and the active zone, said n-doped semiconductor of the buffer layer including a band gap energy lower than or equal to about 97% of the band gap energy of the p-doped semiconductor of the second layer.

12. The light emitting diode according to claim 1, further comprising an electron blocking layer comprising at least one III-N type p-doped semiconductor, the band gap of which is higher than that of the semiconductor of the second layer and which is disposed between the second layer and the active zone.

* * * * *